United States Patent
Fucsko et al.

(10) Patent No.: US 8,969,217 B2
(45) Date of Patent: *Mar. 3, 2015

(54) METHODS OF TREATING SEMICONDUCTOR SUBSTRATES, METHODS OF FORMING OPENINGS DURING SEMICONDUCTOR FABRICATION, AND METHODS OF REMOVING PARTICLES FROM OVER SEMICONDUCTOR SUBSTRATES

(71) Applicant: Micron Technology, Inc., Boise, ID (US)

(72) Inventors: Janos Fucsko, Hatfield, PA (US); Niraj B. Rana, Boise, ID (US); Sandra Tagg, Boise, ID (US); Robert J. Hanson, Boise, ID (US); Gundu M. Sabde, Woodbury, MN (US); Donald L. Yates, Meridian, ID (US); Patrick M. Flynn, Boise, ID (US); Prashant Raghu, Boise, ID (US); Kyle Grant, St. George, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/948,043

(22) Filed: Jul. 22, 2013

(65) Prior Publication Data

US 2013/0302995 A1 Nov. 14, 2013

Related U.S. Application Data

(63) Continuation of application No. 12/136,661, filed on Jun. 10, 2008, now Pat. No. 8,492,288.

(51) Int. Cl.
*H01L 21/302* (2006.01)
*H01L 21/461* (2006.01)
(Continued)

(52) U.S. Cl.
CPC .... *H01L 21/30604* (2013.01); *H01L 21/02052* (2013.01); *H01L 21/31111* (2013.01)
USPC .............. 438/745; 438/689; 438/749; 216/83

(58) Field of Classification Search
None
See application file for complete search history.

(56) References Cited

U.S. PATENT DOCUMENTS 6,039,815 A 3/2000 Yeol et al.
6,158,445 A 12/2000 Olesen et al.
(Continued)

FOREIGN PATENT DOCUMENTS

EP 1065708 1/2001
WO WO 02/01613 1/2002

OTHER PUBLICATIONS

BG Sharma, et al., "Via Cleaning Technology for Post Etch Residues" Solid State Phenomena vols. 103-104 (Apr. 2005) pp. 335-360.
(Continued)

*Primary Examiner* — Nadine Norton
*Assistant Examiner* — Stephanie Duclair
(74) *Attorney, Agent, or Firm* — Wells St. John P. S.

(57) ABSTRACT

Some embodiments include methods of treating semiconductor substrates. The substrates may be exposed to one or more conditions that vary continuously. The conditions may include temperature gradients, concentration gradients of one or more compositions that quench etchant, pH gradients to assist in removing particles, and/or concentration gradients of one or more compositions that assist in removing particles. The continuously varying conditions may be imparted by placing the semiconductor substrates in a bath of flowing rinsing solution, with the bath having at least two feed lines that provide the rinsing solution therein. One of the feed lines may be at a first condition, and the other may be at a second condition that is different from the first condition. The relative amount of rinsing solution provided to the bath by each feed line may be varied to continuously vary the condition within the bath.

16 Claims, 9 Drawing Sheets

(51) Int. Cl.
*C03C 15/00* (2006.01)
*C03C 25/68* (2006.01)
*B08B 3/00* (2006.01)
*H01L 21/02* (2006.01)
*H01L 21/311* (2006.01)
*H01L 21/306* (2006.01)

(56) References Cited

U.S. PATENT DOCUMENTS

| | | | |
|---|---|---|---|
| 6,312,597 | B1 | 11/2001 | Mohindra et al. |
| 6,627,001 | B2 | 9/2003 | Chen |
| 6,821,352 | B2 | 11/2004 | Rovito et al. |
| 6,837,252 | B2 | 1/2005 | Bergman |
| 6,992,017 | B2 | 1/2006 | Peng et al. |
| 7,150,949 | B2 | 12/2006 | Askebjer et al. |
| 2003/0102385 | A1 | 6/2003 | Nguyen |
| 2006/0112971 | A1 | 6/2006 | Kuo et al. |
| 2007/0002296 | A1 | 1/2007 | Chang et al. |
| 2007/0072431 | A1 | 3/2007 | Mun et al. |
| 2007/0093406 | A1 | 4/2007 | Henryson |

OTHER PUBLICATIONS

Murthy Krishna, et al. "Improve yields, enchance CDs wit integrated DUV resist track" Solid State Technology, printed Oct. 17, 2007 pp. 1-8.

METHODS OF TREATING SEMICONDUCTOR SUBSTRATES, METHODS OF FORMING OPENINGS DURING SEMICONDUCTOR FABRICATION, AND METHODS OF REMOVING PARTICLES FROM OVER SEMICONDUCTOR SUBSTRATES

RELATED PATENT DATA

This patent resulted from a continuation application of U.S. patent application Ser. No. 12/136,661 which was filed on Jun. 10, 2008 which is hereby incorporated by reference.

TECHNICAL FIELD

Methods of treating semiconductor substrates, methods of forming openings during semiconductor fabrication, and methods of removing particles from over semiconductor substrates.

BACKGROUND

Semiconductor fabrication may comprise exposure of a semiconductor substrate to one or more etchants to remove materials from the substrate, followed by rinsing of the substrate to remove the etchants.

Problems may occur during the rinsing if an etchant is not rapidly quenched, in that over-etching may occur. In some applications, the etchant may be sufficiently rapidly quenched by simply flushing deionized water across a wafer to remove the etchant. In other applications, flushing with deionized water alone may not be sufficient to quench an etchant with desired rapidity. For instance, if a semiconductor substrate comprises a topography with deep openings (for instance, openings with high aspect ratios that may be utilized for forming capacitors for DRAM), etchant may remain in the bottoms of high aspect ratio features during a rinse, and continue to etch during the rinse.

One method for increasing the rapidity with which etchant is quenched at the bottoms of openings is to include a quench-inducing composition within a rinsing solution. For instance, if the etchant is an acid, a base may be included within the rinsing solution to assist in quenching the acid. Alternatively, if the etchant is a base, an acid may be included in the rinsing solution. Further, hydrogen peroxide and/or hydrogen chloride may be included in a rinsing solution as a quench-inducing composition.

Problems may occur, however, in utilizing quench-inducing compositions, in that such compositions may themselves be etchants for some materials that are along a semiconductor substrate surface. Accordingly, the utilization of the quench-inducing compositions may alleviate some problems, and yet induce other problems that occur from over-etching caused by the quench-inducing compositions.

It is desirable to develop methods which alleviate or prevent the above-discussed over-etching problems.

Other problems that may occur during semiconductor processing are that particles may form across a semiconductor substrate. Various methods have been developed for removing such particles, but yet problems associated with the particles persist. Accordingly, it is desired to develop new approaches for removing particles from semiconductor substrates.

DETAILED DESCRIPTION OF THE ILLUSTRATED EMBODIMENTS

In some embodiments, it is recognized that improvements may be made to the utilization of rinses for removing residual etch chemicals, etch residue and particles from surfaces of semiconductor substrates. Conventional rinses may suffer from numerous problems. For instance, there may be a thick boundary layer formed between etchant solution and rinse solution within topographical features, which renders it difficult to effectively remove the etchant solution. Further, mass transport through such boundary layer may be diffusion limited, and thus too slow to enable rapid quenching of an etchant solution. This problem may be particularly prevalent when there are deep vias or complex structures present along the surface of a semiconductor substrate.

Problems may also occur during intended removal of particles. The particles may be chemically absorbed onto a semiconductor surface and/or retained on the surface by electrostatic forces.

Figure 1:
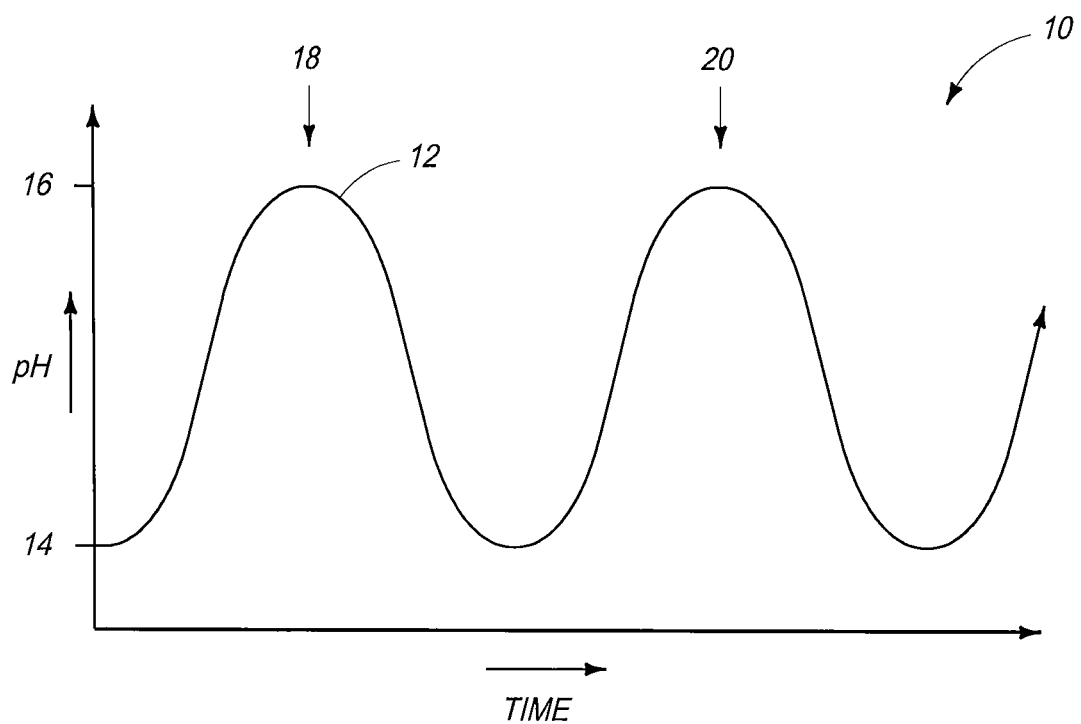
FIGS. 1-3 are graphical illustrations of dynamic changes in pH, concentration and temperature, relative to time, that may occur in some embodiments.
Figure 2:
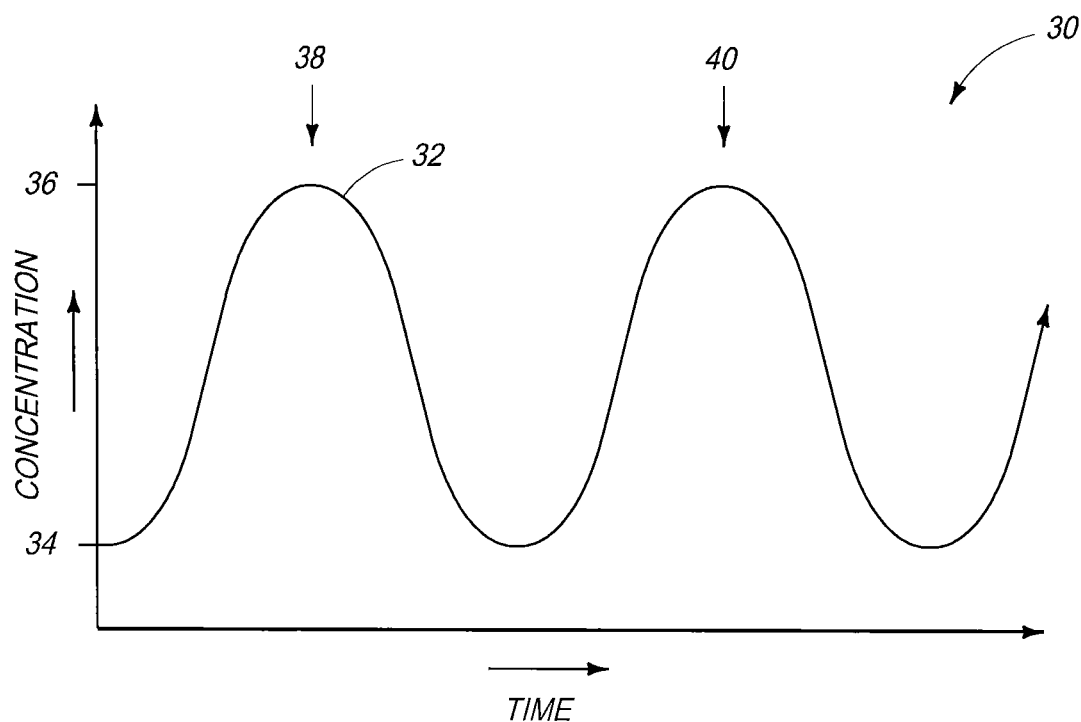
Figure 3:
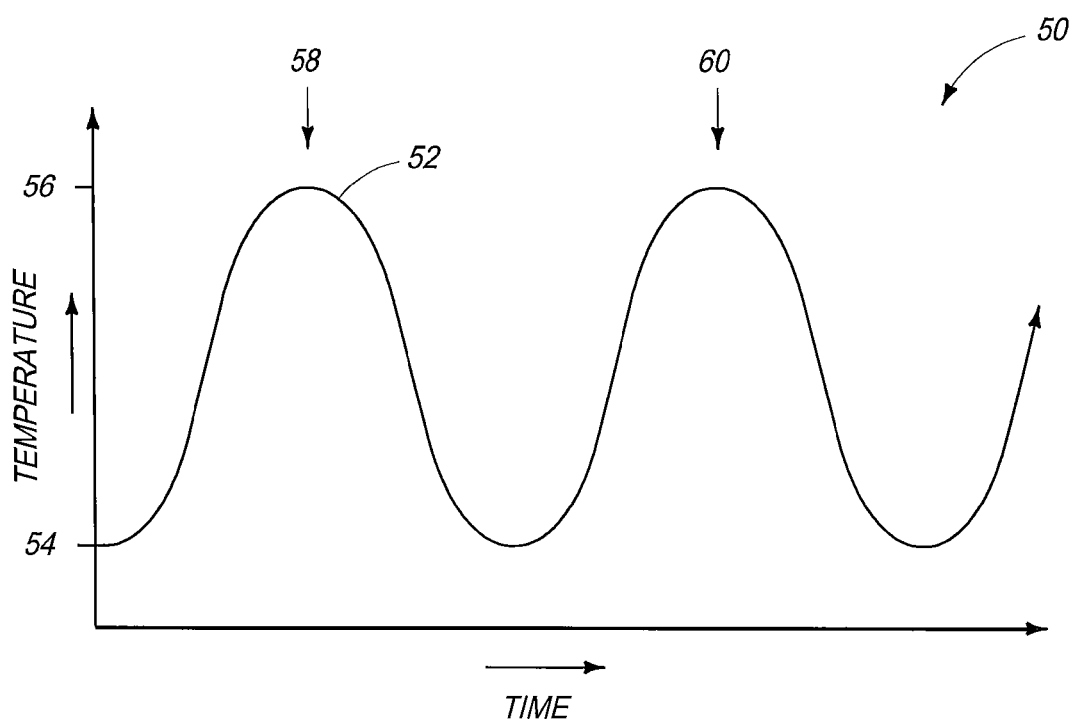

In some embodiments, the problems are addressed by dynamically altering a rinse solution during utilization of the rinse solution. The dynamic alteration may comprise alteration of any of numerous properties of the solution, including, for example, a temperature of the solution, a pH of the solution, and/or concentrations of one or more components of the solution. FIGS. 1-3 graphically illustrate dynamic alteration of pH, concentration of a component, and temperature, respectively.

Referring to FIG. 1, a graph 10 comprises an x-axis corresponding to time, and a y-axis corresponding to pH. A curve 12 shows the variation of the pH of a rinse solution with time, and specifically shows that the pH is continuously variable over a period of time. In other words, the pH is non-static over the period of time, as opposed to reaching a static equilibrium. The shown curve corresponds to a pH gradient. The example curve may be considered to comprise two iterations of a process in which the pH goes from a first value 14 (shown as a low value) to a second value 16 (shown as a high value), and then back to the first value; with one of the iterations comprising a peak 18 of curve 12, and the other comprising a peak 20 of the curve. Although the shown iterations go from a low pH to a high pH, and then back; in other embodiments the iterations may go from a high pH to a low pH, and then back.

The low pH 14 and high pH of 16 may differ from one another by five or more pH units, and in some embodiments may differ from one another by eight or more pH units. For instance, the low pH 14 may correspond to 2 (or another suitable acidic pH), and the high pH 16 may correspond to 10 (or another suitable basic pH).

The time for each iteration from a low pH to a high pH, and back, may be any suitable duration; and may be, for example, at least a few seconds.

The curve 12 is shown to be continuously variable during the entire duration illustrated in graph 10. The fluctuation of the pH between the low and high pH's may be referred to as pH sweeping.

The pH-sweeping may provide benefits during the rinsing of a substrate including, for example, inhibition of etch conditions as discussed below with reference to FIGS. 5-8, and assistance in particle removal as discussed below with reference to FIGS. 9-14.

Referring to FIG. 2, a graph 30 comprises an x-axis corresponding to time, and a y-axis corresponding to concentration. A curve 32 shows the variation of the concentration of a composition within a rinse solution with time, and specifically shows that the concentration of the composition is continuously variable over a period of time. In other words, the concentration of the composition is non-static over the period time, as opposed to reaching a static equilibrium.

The shown curve corresponds to a concentration gradient. The curve may be considered to comprise two iterations of a process in which the concentration of the composition goes from a first value 34 to a second value 36, and then back to the first value; with one of the iterations comprising a peak 38 of curve 32, and the other comprising a peak 40 of the curve. Although the shown iterations go from a low concentration of the composition to a high concentration of the composition, and then back; in other embodiments the iterations may go from a high concentration of the composition to a low concentration of the composition, and then back.

The low concentration 34 and high concentration 36 may differ from one another by several fold, and in some embodiments may differ from one another by one or more orders of magnitude. For instance, the composition may comprise hydrogen chloride (i.e., hydrochloric acid) utilized to quench an etch, the low concentration may correspond to about 1 ppm (part per million), and the high concentration may correspond to about 1000 ppm. In other embodiments, the low concentration of the hydrogen chloride may correspond to about 10 ppm and the high concentration to about 1000 ppm. In yet other embodiments, the low concentration of the hydrogen chloride may correspond to about 1 ppm and the high concentration to about 10 ppm.

The composition having the variable concentration may be any suitable composition for treating a substrate during a rinse, and in some embodiments multiple compositions may simultaneously be varied in concentration during the treatment of a substrate. Example compositions that may be utilized in addition to, or alternatively to, the above-discussed hydrogen chloride are inorganic acids (for instance, hydrofluoric acid, nitric acid, sulfuric acid, phosphoric acid, etc.), organic acids (for instance, acetic acid, trichloroacetic acid, etc.) and bases (for instance, ammonium hydroxide, tetramethyl ammonium hydroxide, tetraethyl ammonium hydroxide, etc.). The bases may be inorganic bases (for instance, ammonium hydroxide) or organic bases (for instance, tetramethyl ammonium hydroxide). Any of the compositions may be provided to the high and low concentrations discussed above with reference to the hydrogen chloride, or may be provided to other high and low concentrations appropriate for particular applications.

The time for each iteration from a low concentration to a high concentration, and back, may be any suitable duration; and may be, for example, at least three seconds in embodiments in which the low concentration and high concentration differ from one another by an order of magnitude or more.

The curve 32 is shown to be continuously variable during the entire duration illustrated in graph 30. The fluctuation of the concentration between the low and high concentrations of a particular composition may be ceased at some point, and the substrate exposed to a static, equilibrium, concentration of the composition.

The alteration of a concentration of one more compositions may provide benefits during the rinsing of a substrate including, for example, inhibition of etch conditions as discussed below with reference to FIGS. 5-8, and assistance in particle removal as discussed below with reference to FIGS. 9-14.

Referring to FIG. 3, a graph 50 comprises an x-axis corresponding to time, and a y-axis corresponding to temperature. A curve 52 shows the variation of the temperature of a rinse solution with time, and specifically shows that the temperature is continuously variable over a period of time. In other words, the temperature is non-static over the period time, as opposed to reaching a static equilibrium. The shown curve corresponds to a temperature gradient. The curve may be considered to comprise two iterations of a process in which the temperature goes from a first value 54 to a second value 56, and then back to the first value; with one of the iterations comprising a peak 58 of curve 52, and the other comprising a peak 60 of the curve. Although the shown iterations go from a low temperature to a high temperature, and then back; in other embodiments the iterations may go from a high temperature to a low temperature, and then back.

The low temperature 54 and high temperature of 56 may differ from one another by at least about 30° C., and in some embodiments may differ from one another by at least about 60° C. For instance, the low temperature 54 may correspond to about room temperature (23° C.), and the high temperature 56 may correspond to about 90° C.

The time for each iteration from a low temperature to a high temperature, and back, may be any suitable duration; and may be, for example, at least a few seconds in embodiments in which the low temperature and high temperature differ from one another by at least about 30° C.

The curve 52 is shown to be continuously variable during the entire duration illustrated in graph 50. The fluctuation of the temperature between the low and high temperatures may be referred to as temperature sweeping. At some point the temperature sweeping may be ceased, and the substrate exposed to a static, equilibrium, temperature. Such may be accomplished by flowing a static temperature rinse solution across the substrate.

The temperature sweeping may provide benefits during the rinsing of a substrate by enhancing kinetics of reactions in some embodiments, or by inhibiting kinetics of reactions in other embodiments. Some examples of such effects on kinetics are discussed below with reference to FIGS. 9-14.

The dynamic alteration of various properties of the rinse solution may be accomplished by any suitable method. An example method is described with reference to FIG. 4.

Figure 4:
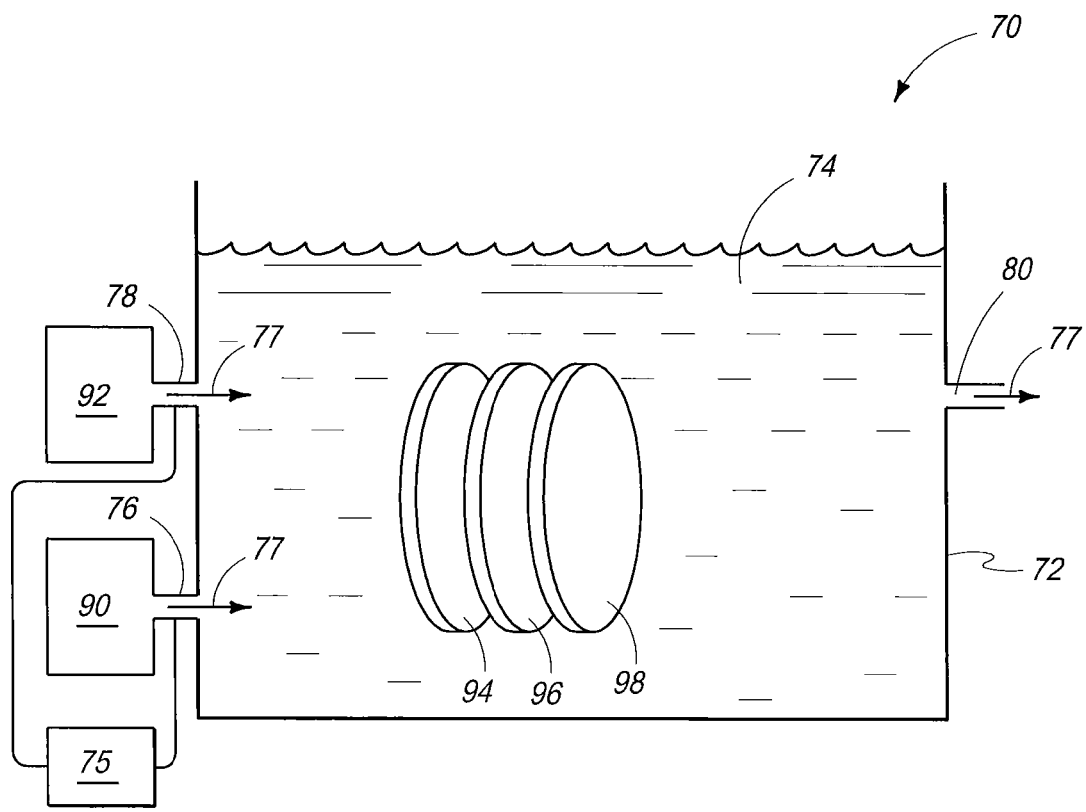
FIG. 4 is a diagrammatic cross-sectional view of an apparatus, shown in process for treating a batch of wafers, in accordance with an embodiment.

FIG. 4 shows an apparatus 70 comprising a vessel 72 that retains a rinse solution bath 74. A pair of feed lines 76 and 78 are in fluid connection with the bath and configured for feeding liquid into the bath, and an outlet line 80 is in fluid connection with the bath and configured for draining liquid from the bath. Flow of liquid through the bath is illustrated by arrows 77. The liquid may flow continuously during the dynamic alteration of one or more properties of the bath solution.

Although two feed lines are illustrated, in other embodiments there may be more than two feed lines. Also, although the feed lines are shown passing liquid directly to the vessel, in other embodiments the feed lines may merge upstream of the vessel so that liquid is provided from the feed lines to the bath through an intermediate carrier line.

Feed line 76 is shown to be in fluid connection with a reservoir 90, and feed line 78 is shown to be in fluid connection with a reservoir 92. In operation, one of the reservoirs may contain rinse solution under a first condition, and the other reservoir may contain rinse solution under a second condition, and the relative ratio of the amount of liquid passed through feed lines 76 and 78 may then determine the condition of the bath 74. The feed lines 76 and 78 may each be connected to a processor 75 which controls the amount of liquid passing through each of the lines. The control of liquid through the lines may comprise utilization of one or more valves (not shown).

In embodiments in which a continuously variable pH is desired, one of the reservoirs 90 and 92 may comprise rinse liquid at a pH that is at or below a lowest pH of the continuously variable pH (in other words, at or below the pH 14 of FIG. 1), and the other of the reservoirs may comprise the rinse liquid at a pH that is at or above the highest pH of the continuously variable pH (in other words, at or above the pH 16 of FIG. 1). The amount of rinse liquid provided through feed line 76 relative to that provided through feed line 78 may then be continuously varied to achieve the continuously varying pH.

In embodiments in which a continuously variable concentration of a component is desired, one of the reservoirs 90 and 92 may comprise rinse liquid with a first concentration of the component that is at or below a lowest component concentration of the continuously variable component concentration (in other words, at or below the component concentration 34 of FIG. 2), and the other of the reservoirs may comprise the rinse liquid having a component concentration that is at or above the highest component concentration of the continuously variable component concentration (in other words, at or above the component concentration 36 of FIG. 2). The amount of rinse liquid provided through feed line 76 relative to that provided through feed line 78 may then be continuously varied to achieve the continuously varying component concentration.

In embodiments in which a continuously variable temperature is desired, one of the reservoirs 90 and 92 may comprise rinse liquid at a temperature that is at or below a lowest temperature of the continuously variable temperature (in other words, at or below the temperature 54 of FIG. 3), and the other of the reservoirs may comprise the rinse liquid at a temperature that is at or above the highest temperature of the continuously variable temperature (in other words, at or above the temperature 56 of FIG. 3). The amount of rinse liquid provided through feed line 76 relative to that provided through feed line 78 may then be continuously varied to achieve the continuously varying temperature.

If it is desired to continuously vary two or more parameters, multiple feed lines and reservoirs may be provided so that the parameters may be altered independently of one another; or, in other embodiments, multiple parameters may be simultaneously varied with two or more common reservoirs so that the parameters are linked to one another. In some embodiments, one or more of the properties of temperature, acid concentration, base concentration, passivating material concentration and pH may be altered within the bath 74. If two or more of the properties are altered, they may be altered simultaneously with one another in some embodiments, and/or sequentially with one another in other embodiments.

A plurality of semiconductor substrates 94, 96 and 98 are shown within bath 74. The substrates may be held within a support structure (not shown). The substrates are treated simultaneously with one another, and accordingly correspond to a batch of substrates treated within apparatus 70. In other embodiments (not shown), semiconductor substrates may be treated singly, rather than in batch.

The semiconductor substrates may correspond to monocrystalline silicon wafers having one or more layers of integrated circuit components formed thereover. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although two inlet lines (i.e., feed lines) are shown extending into bath 74, in other embodiments only one feed line may be utilized if there are one or more mixing points along the feed line prior to the line entering the bath.

One or more of the embodiments of FIGS. 1-4 may be incorporated into any semiconductor fabrication process in which it is desired to expose a semiconductor substrate to dynamic conditions. An example fabrication process in which one or more of the embodiments of FIGS. 1-4 may be utilized during rinsing of etchant and/or quenching of an etch is described with reference to FIGS. 5-8; and examples of fabrication processes in which one or more of the embodiments of FIGS. 1-4 are utilized during particle removal are described with reference to FIGS. 9-14.

Figure 5:
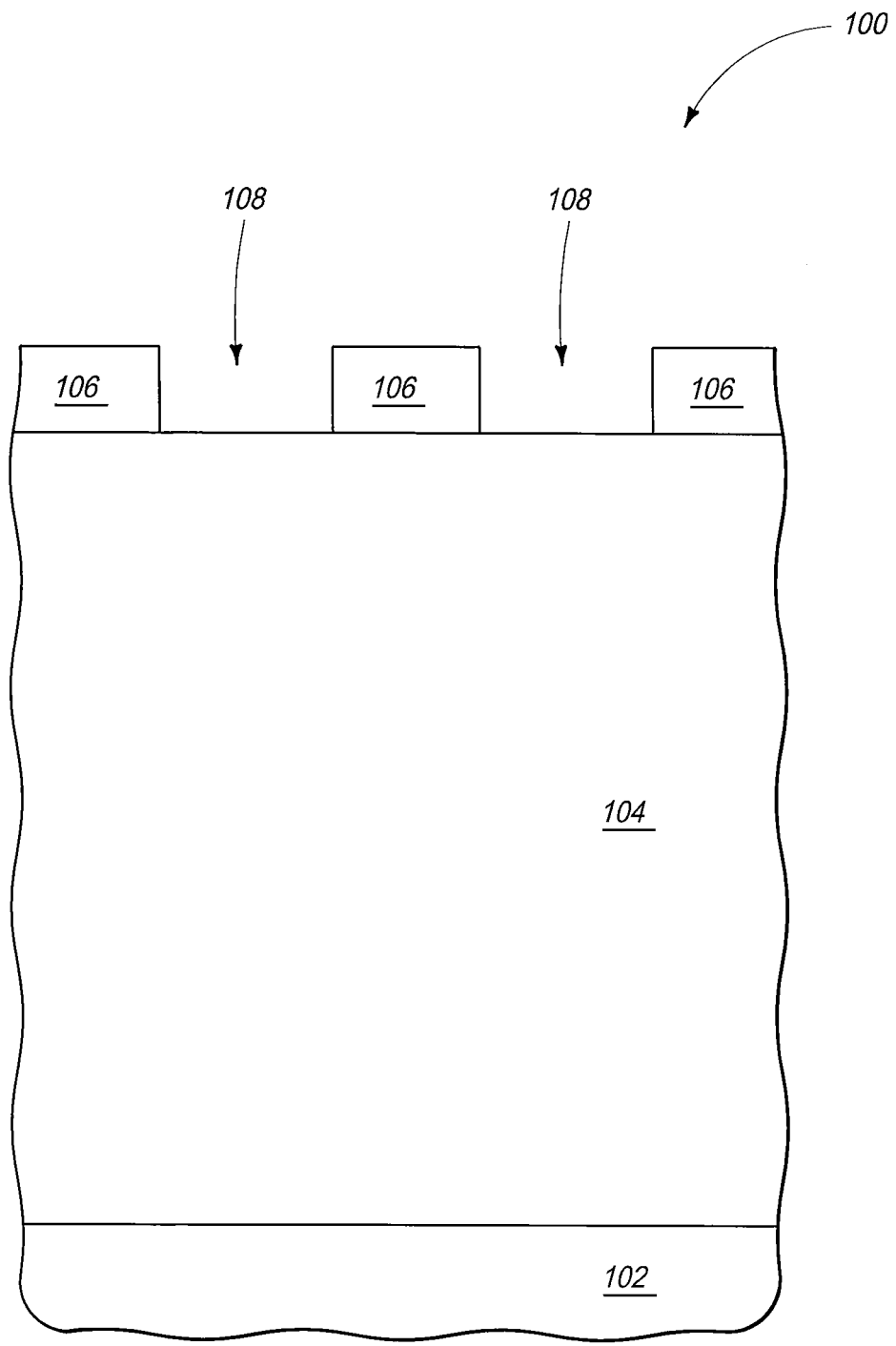
FIGS. 5-8 are diagrammatic, cross-sectional views of a semiconductor wafer fragment at various process stages of an embodiment.

Referring to FIG. 5, a semiconductor construction 100 is illustrated. The construction includes a semiconductor base 102 which may, for example, comprise, consist essentially of, or consist of monocrystalline silicon lightly doped with background p-type dopant. Although base 102 is shown to be homogenous, it is to be understood that the base may comprise numerous layers in some embodiments. For instance, base 102 may correspond to a semiconductor substrate containing one or more layers associated with integrated circuit fabrication. In such embodiments, such layers may correspond to one or more of metal interconnect layers, barrier layers, diffusion layers, insulator layers, etc.

A material 104 is formed over base 102. Material 104 may comprise any suitable material, and in some embodiments may be an electrically insulative material comprising one or more compositions selected from the group consisting of borophosphosilicate glass (BPSG), silicon dioxide, silicon nitride, etc.

A patterned masking material 106 is formed over material 104. The masking material 106 may comprise, for example, photolithographically-patterned photoresist. The patterned masking material forms a patterned mask having a pair of openings 108 extending therethrough.

Figure 6:
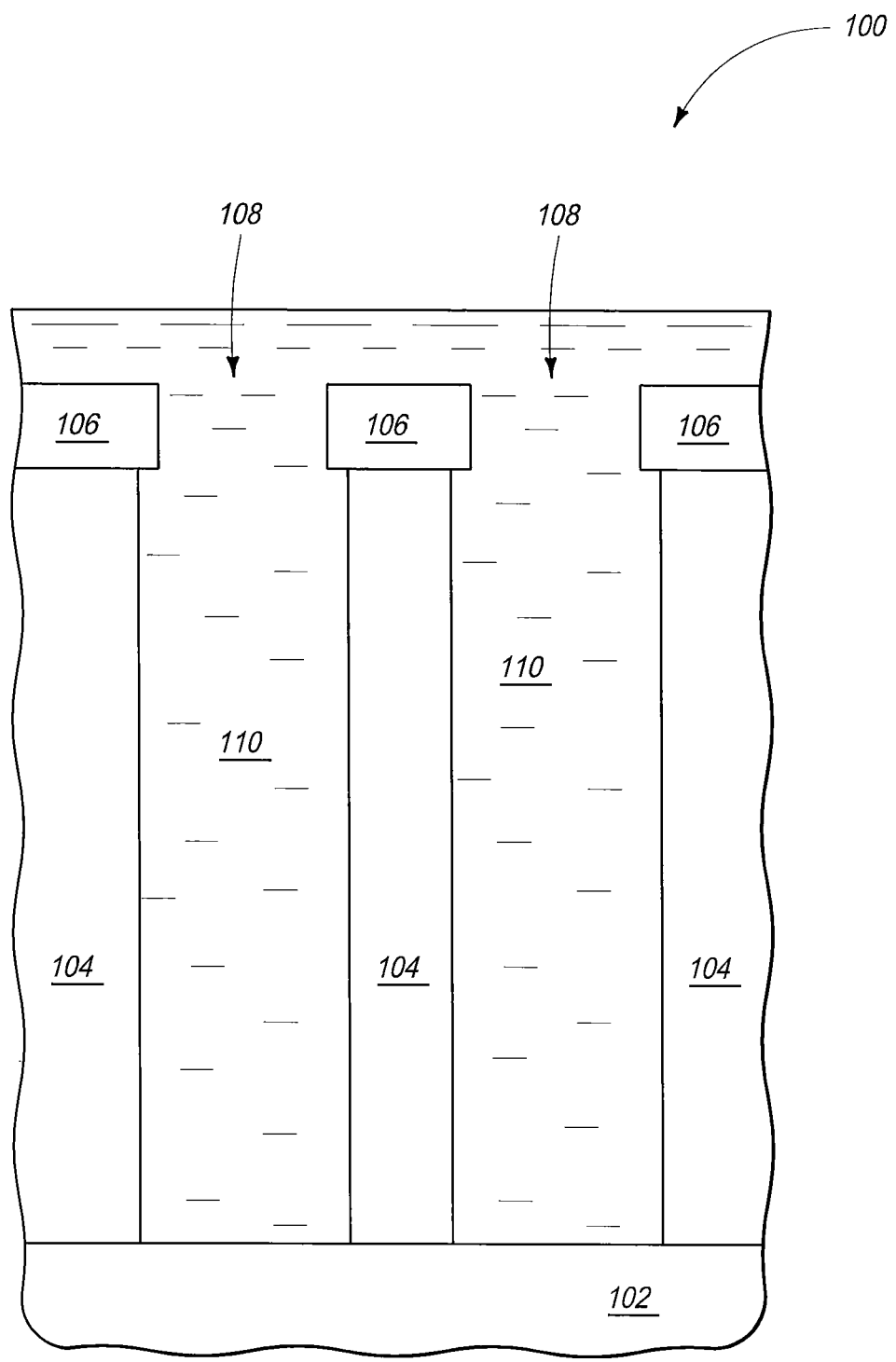

Referring to FIG. 6, openings 108 are extended into material 104 with one or more suitable etches. Some etchant 110 is diagrammatically illustrated as fluid within openings 108. Such may occur if at least part of the etch utilized to form openings 108 is conducted with wet etching.

The etchant 110 comprises one or more compositions suitable for removing material 104. Such compositions will vary depending on the composition of material 104. In an example embodiment, material 104 may comprise silicon dioxide and the etchant may comprise hydrofluoric acid (either alone, or with ammonium ion as a buffered oxide etch). In another example embodiment, there may be at least some organic material exposed within openings 108, and the etchant may comprise piranha solution (hydrogen peroxide in combination with sulfuric acid, phosphoric acid and/or ammonium hydroxide) for removing at least a portion of the organic material. In another example embodiment, there may be at least some oxide material exposed within openings 108 (silicon dioxide or metal oxides), and the etchant may comprise QE2 solution ($NH_4$ in combination with phosphoric acid and other components, such as HF) for removing at least a portion of the oxide material. The fluid-based etch may be isotropic, and accordingly may undercut masking material 106, as shown.

The openings 108 within material 104 may be utilized for forming any of numerous components utilized in integrated circuitry. In some embodiments, the openings may be high aspect ratio openings suitable for fabrication of tightly-stacked capacitors for highly-integrated dynamic random access memory (DRAM) arrays.

Figure 7:
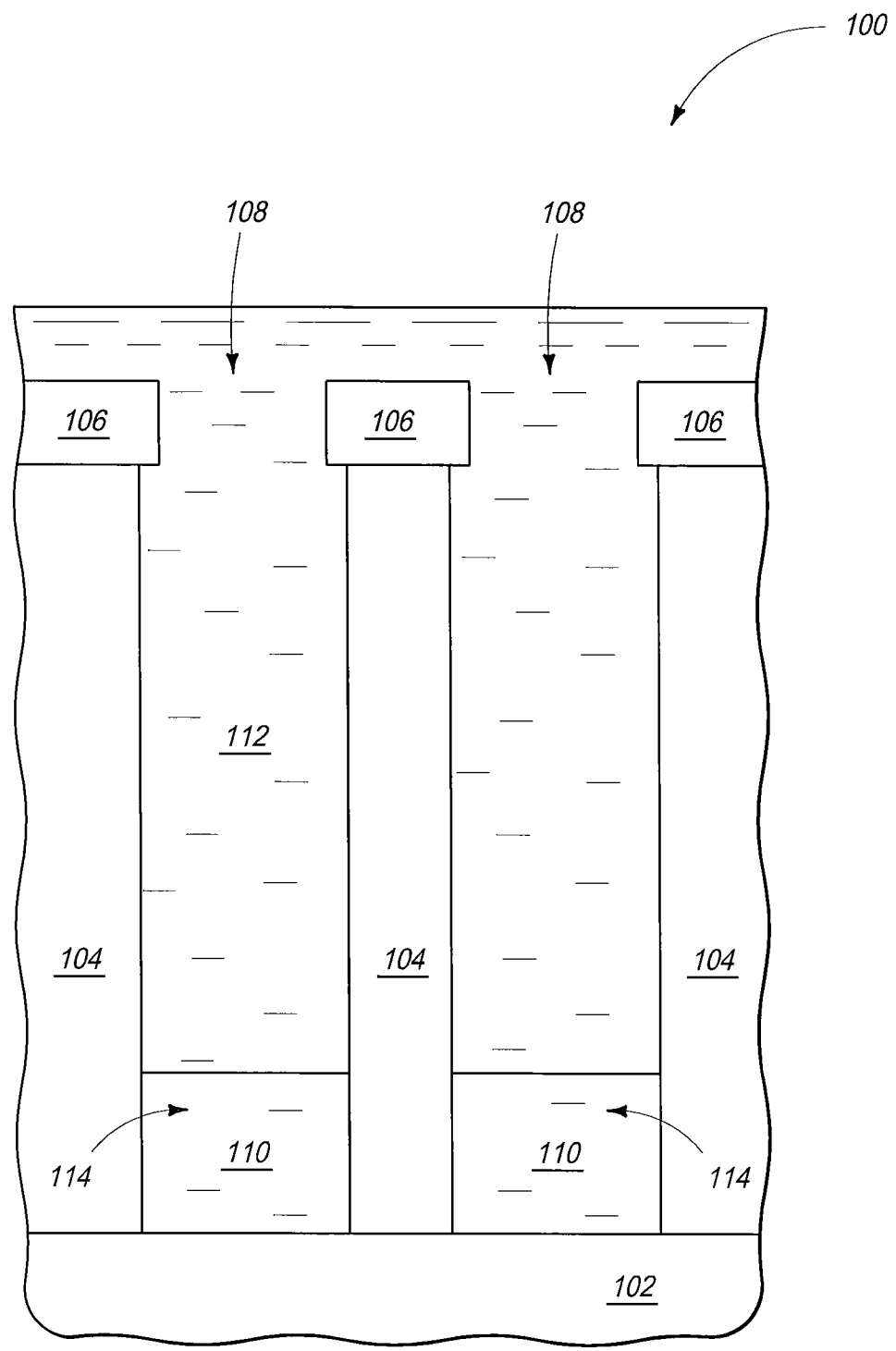

Referring to FIG. 7, a rinse solution 112 is utilized to remove etchant 110 from within openings 108. The rinse solution quickly removes most of the etchant 110, but eddies 114 of etchant 110 remain within the bottoms of the openings, or remain in a diluted form anywhere in the openings. The etchant remaining within the openings may problematically continue etching until the rinse solution manages to disperse the material 110 from the openings.

In some embodiments, one or more of the procedures of FIGS. 1-3 is utilized to dynamically alter the rinse solution and thereby reduce problematic etching occurring from etchant remaining in the eddies 114 at the bottoms of the openings.

For instance, if the etchant comprises acid, then the rinse solution may have the fluctuating pH of FIG. 1 so that the acid is at least partially neutralized while the rinse solution is removing the acid from the openings. The fluctuating pH may avoid problems that could occur with a rinse solution having a static basic pH; with an example problem being undesired etching of base-sensitive materials.

As another example, if the etching induced by the etchant has a rate significantly influenced by temperature, the rinse solution may have the fluctuating temperature of FIG. 3 while the rinse solution is removing the etchant 110 from within the openings. The fluctuating temperature may avoid problems that could occur with a static low-temperature rinse solution or static high-temperature rinse solution, such as undesired thermal stresses on materials. Such thermal stresses may occur if adjacent materials have substantially different thermal coefficients.

As yet another example, the etchant may be passivated (i.e., quenched) by various materials. For instance, acids may be quenched by bases; bases may be quenched by acids; and various etchants may be quenched by oxidants, such as hydrogen peroxide or ozone, or by reductants. The rinse solution may have the fluctuating concentration of FIG. 2 while the rinse solution is removing the etchant 110 from within the openings, with such fluctuating concentration being the concentration of a passivating material. The fluctuating concentration may avoid problems that could occur with a static concentration of the passivating material in the rinse solution, such as undesired etching induced by the passivating material.

In some embodiments, two or more of the procedures of FIGS. 1-3 may be utilized simultaneously with one another. For instance, the concentration of passivating material within a rinse solution may be fluctuated together with a temperature of the rinse solution during utilization of the rinse solution to remove etchant. Also, in some embodiments, first fluctuating conditions for quenching an etch may be followed by second fluctuating conditions for removing contaminants.

Figure 8:
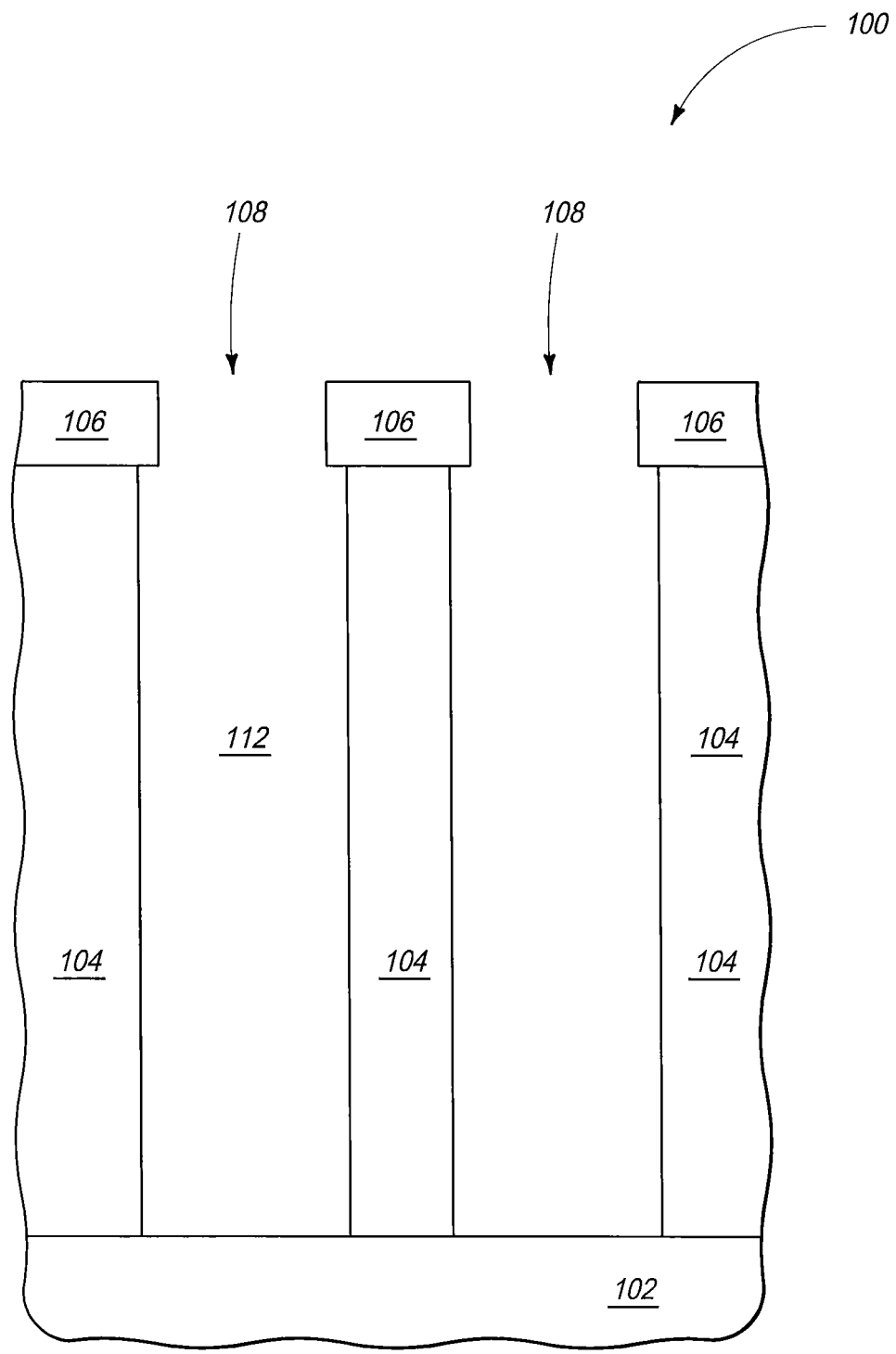

After the rinse solution is utilized to remove the etchant, deionized water may be utilized to remove the rinse solution, and then construction 100 may be dried to leave the construction shown in FIG. 8. Subsequently, integrated circuit components may be formed within the openings. For instance, capacitors may be formed within the openings during fabrication of DRAM.

Figure 9:
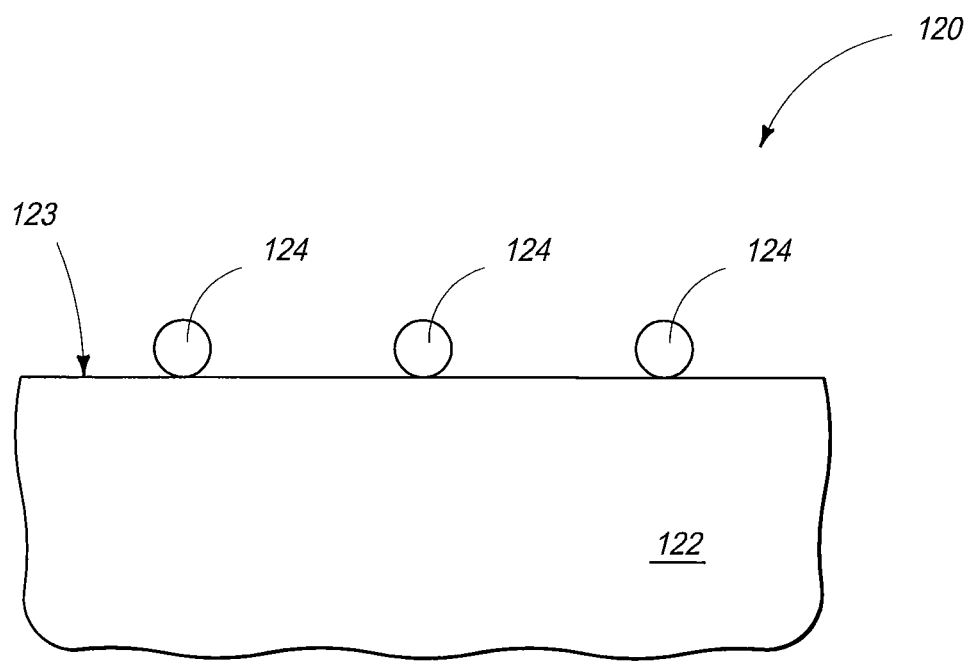
FIGS. 9 and 10 are diagrammatic, cross-sectional views of a semiconductor wafer fragment at sequential process stages of an embodiment.
Figure 10:
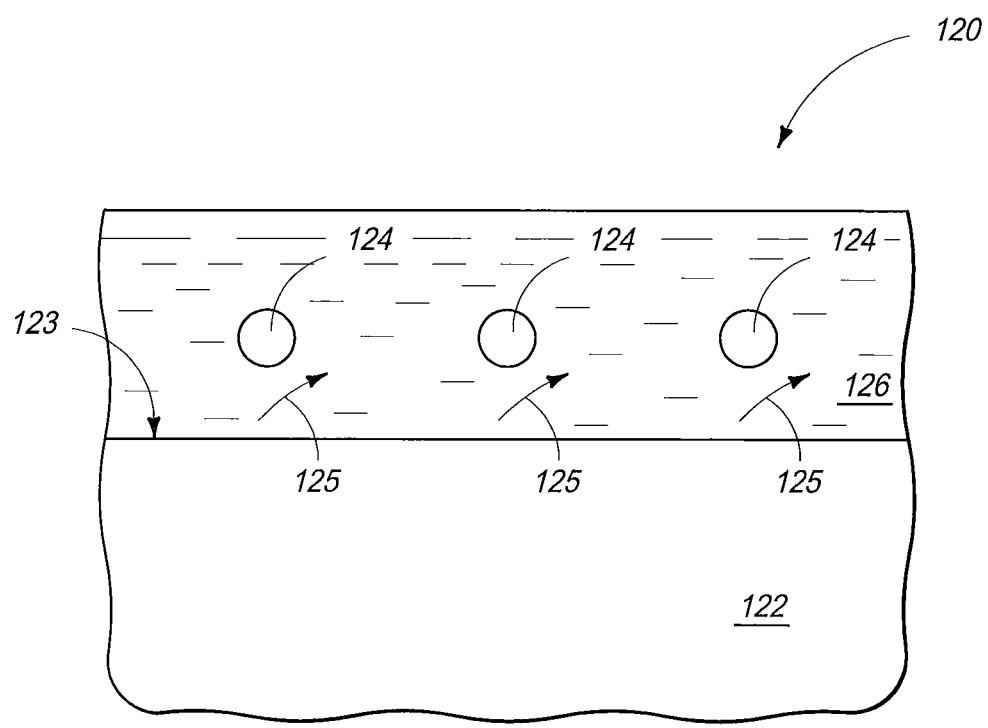

FIGS. 9 and 10 illustrate an example embodiment for removing particles from over a semiconductor substrate. Referring to FIG. 9, a semiconductor construction 120 is shown to comprise a semiconductor substrate 122 having particles 124 thereover. The substrate 122 may comprise, for example, a monocrystalline silicon wafer. The substrate may have a silicon-containing surface 123, such as a surface comprising, consisting essentially of, or consisting of one or more of silicon, silicon dioxide or silicon nitride. The particles 124 may comprise particles formed during etching or other semiconductor processing. The particles may comprise, consist essentially of, or consist of any of various materials; including, for example, one or more of metals, silicon, silicon dioxide, silicon nitride, organic materials, etc.

Particles 124 may adhere to surface 123 through chemical bonds and/or electrostatic interactions. If the particles adhere solely through electrostatic interactions, one or both of the surface 123 and the particles 124 may comprise pH-sensitive charged groups. For instance, particles 124 may comprise carboxylate groups that are negatively charged above a threshold pH, and neutrally charged below the threshold pH. As another example, particles 124 may comprise amine groups that are positively charged below a threshold pH, and neutrally charged above the threshold pH.

In some embodiments, surface 123 will comprise a negative charge (for example, from hydroxyl groups extending from the surface), and particles 124 will be electrostatically retained to the surface through positively-charged amine groups. The electrostatic interaction can thus be disrupted by exposing particles 124 to a pH which neutralizes the positively charged amine groups, or changes a charge to be negative.

FIG. 10 shows construction 120 as particles 124 are exposed to a rinse solution 126 comprising a pH which neutralizes the electrostatic interactions and causes particles 124 to be dispersed into the rinse solution (as illustrated by arrows 125). The rinse solution may have a dynamically changing pH utilizing methodology described above with reference to FIG. 1. The dynamically changing pH enables appropriate pH's to be found for rinsing different types of particles from a substrate. Specifically, there may be many types of particles with many varying electrostatic interactions that retain the particles to different types of surfaces across a semiconductor substrate. Utilization of the pH sweeping of FIG. 1 within a rinse solution may enable each type of particle to be removed. Specifically, the pH sweep may be configured to pass through the particular pH's that neutralize electrostatic interaction of each type of particle so that eventually each type of particle will be neutralized and removed from the surface. In some embodiments, at least some of the particles may have their charge reversed relative to the charge of the substrate during the pH sweeping so that the electrostatic interactions between the substrate and particles change form attractive to repulsive, which may aid in removing the particles from the substrate.

A problem that may occur is that the strength of the electrostatic interactions between particular types of particles and the substrate may fluctuate as the pH fluctuates within the rinse solution. Accordingly, particles ejected from one location of the substrate may settle onto another location of the substrate. For instance, there are often many more particles along the edges of a semiconductor substrate than across a central region of the substrate, and the pH sweeping within the rinse solution may cause particles to migrate from the edges of the semiconductor substrate to the central region. If such problems occur, the pH sweeping may be conducted through several iterations until the number of particles remaining on the substrate has been reduced to a level below a desired tolerance.

If the particles are retained on substrate 122 through chemical bonds, as well as electrostatic interactions, etchant may be included within the rinse solution to weaken the chemical bonds. The etchant may comprise a composition which removes material from surface 123 of the substrate, and/or may comprise a composition which removes material from the particles.

Figure 11:
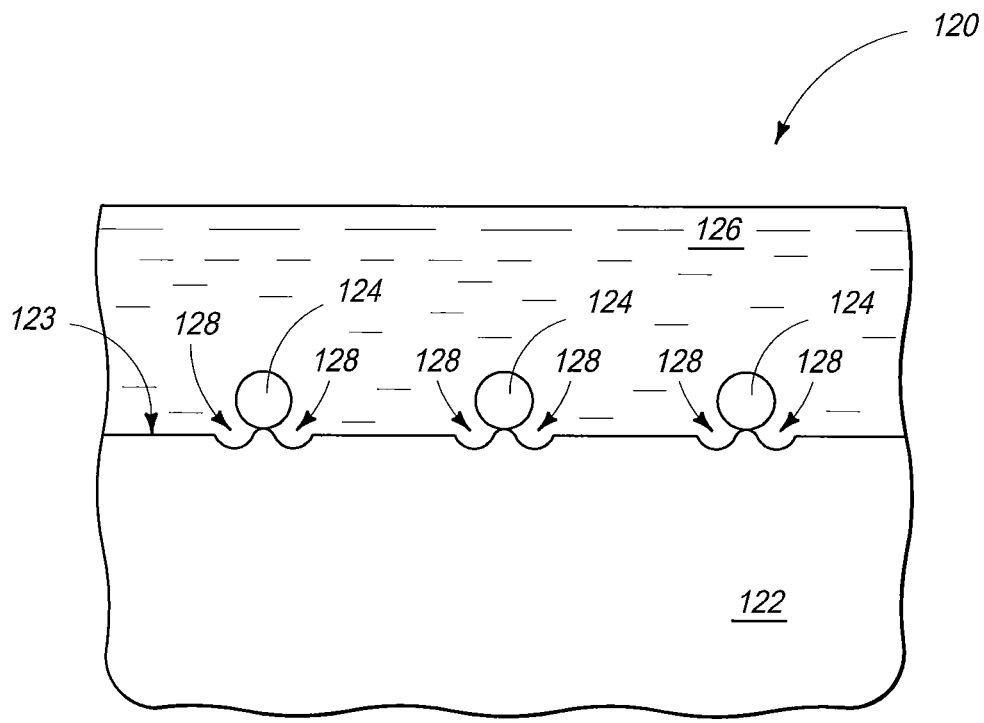
FIGS. 11 and 12 are diagrammatic, cross-sectional views of a semiconductor wafer fragment at sequential process stages of an embodiment.
Figure 12:
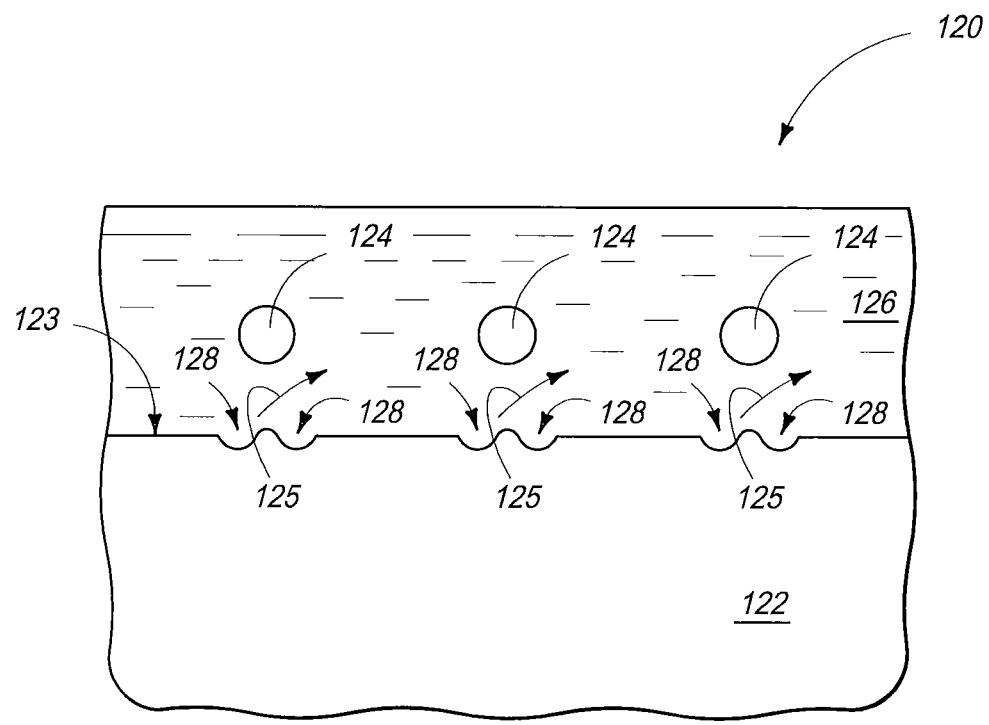

FIGS. 11 and 12 illustrate an embodiment in which the rinse solution comprises a composition which removes material from surface 123. FIG. 11 shows construction 120 at a processing stage subsequent to FIG. 9, and as surface 123 is initially exposed to rinse solution 126. The etchant within the rinse solution removes substrate 122 from under the particles. Such undercuts the particles, and specifically forms voids 128 extending under particles 124. The undercutting of the particles weakens chemical bonding between the particles 124 and the substrate 122. In an example embodiment, surface 123 may comprise silicon dioxide, and the etchant may comprise hydrofluoric acid.

The concentration of the etchant within the rinse solution may be dynamically altered utilizing the methodology of FIG. 2. Such may avoid, or at least alleviate, undesired etching of substrate 122.

If the etchant has an etch rate significantly influenced by temperature, the temperature of the rinse solution may be dynamically altered utilizing the methodology of FIG. 3, either additionally, or alternatively, to the alteration of the concentration of the etchant within the rinse solution.

Referring to FIG. 12, particles 124 are dispersed from surface 123. Such dispersal may be due entirely to the undercutting of the particles induced by the etching, and accordingly may occur without pH sweeping within the rinse solution. Alternatively, the dispersal may be enhanced by reducing electrostatic attraction between the particles and the substrate through pH sweeping within the rinse solution. Such pH sweeping may occur during or after the utilization of the etchant to undercut the particles.

Figure 13:
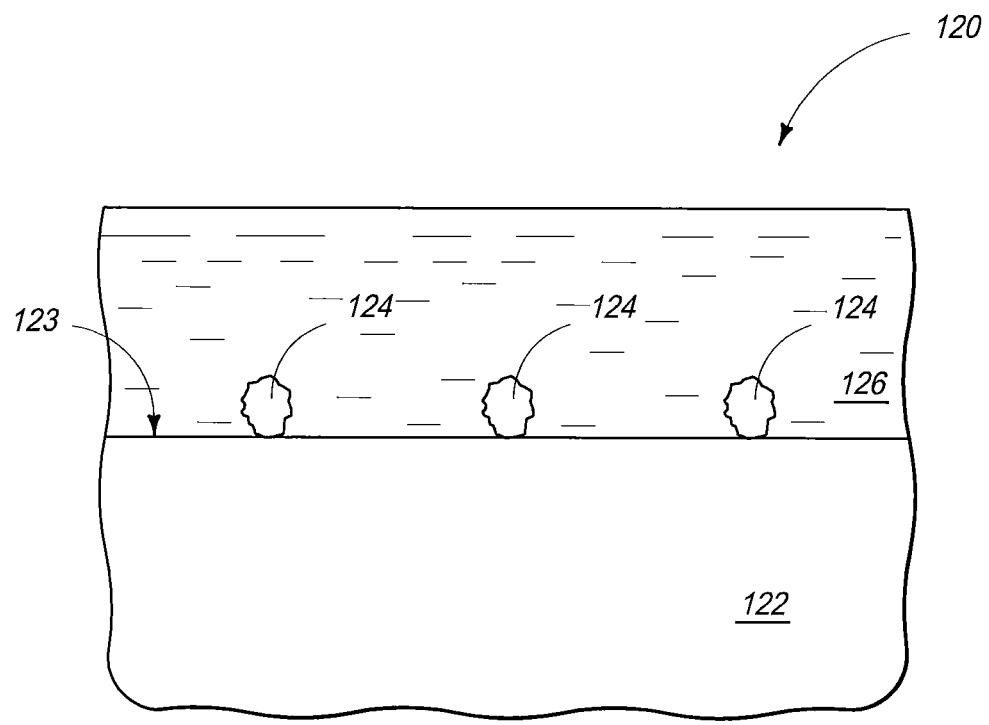
FIGS. 13 and 14 are diagrammatic, cross-sectional views of a semiconductor wafer fragment at sequential process stages of an embodiment.
Figure 14:
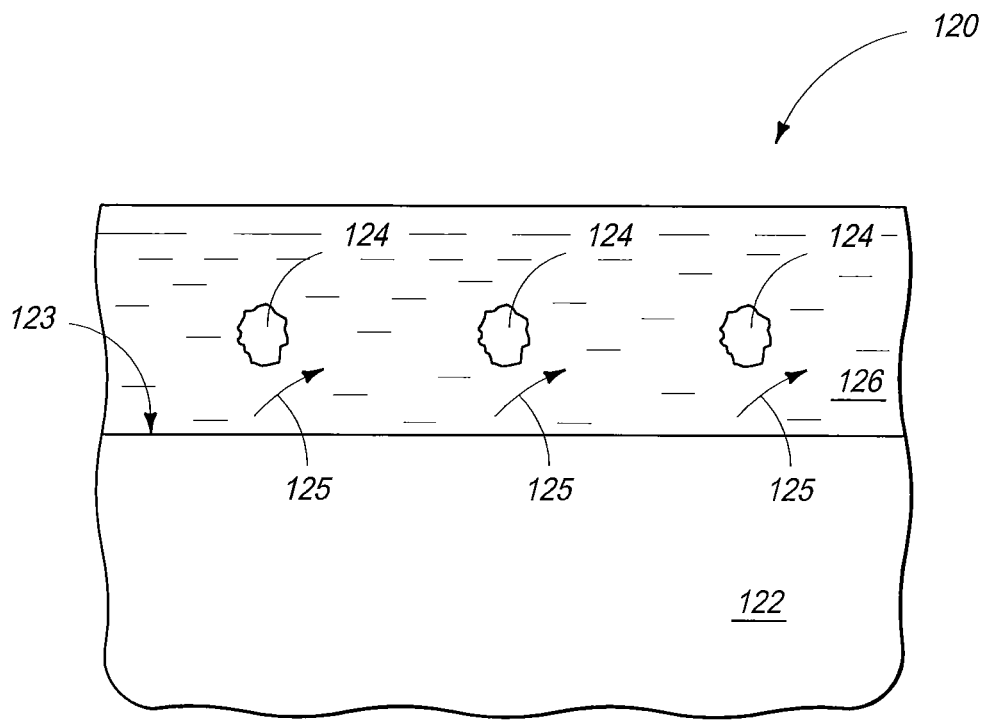

FIGS. 13 and 14 illustrate an embodiment in which the rinse solution comprises a composition which removes material from particles 124. FIG. 13 shows construction 120 at a processing stage subsequent to FIG. 9, and as particles 124 are initially exposed to rinse solution 126. The etchant within the rinse solution removes material from the particles, and alters the outer surface of the particles to reduce the area of the interfaces between the particles and the substrate. The etching of the particles thus weakens chemical bonding between the particles 124 and the substrate 122. In an example embodiment, the particles may comprise organic material, and the etchant may be a piranha mixture.

The concentration of the etchant within the rinse solution may be dynamically altered utilizing the methodology of FIG. 2. Such may avoid, or at least alleviate, undesired etching of substrate 122.

If the etchant has an etch rate significantly influenced by temperature, the temperature of the rinse solution may be dynamically altered utilizing the methodology of FIG. 3, either additionally, or alternatively, to the alteration of the concentration of the etchant within the rinse solution.

Referring to FIG. 14, particles 124 are dispersed from surface 123. Such dispersal may be due entirely to the reduction of the amount of interface between the particles and substrate induced by the etching, and accordingly may occur without pH sweeping within the rinse solution. Alternatively, the dispersal may be enhanced by reducing electrostatic attraction between the particles and the substrate through pH sweeping within the rinse solution. Such pH sweeping may occur during or after the etching of the particles.

Although FIGS. 10-14 illustrate embodiments in which the etching of the substrate occurs separately from the etching of the particles, in other embodiments etchant may be chosen which etches both the substrate and the particles.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of treating a semiconductor substrate comprising exposing the substrate to a composition to quench an etch process and remove particles, wherein said exposure to the composition comprises exposure to a continuously varying concentration gradient of the composition for a duration of at least three seconds; the continuously varying concentration gradient including repetitive iterations of increasing concentration from a low concentration to a high concentration and of decreasing concentration from the high concentration to the low concentration; the low and high concentrations differing from one another by at least a factor of ten.

2. The method of claim 1 wherein the composition includes one or more inorganic acids.

3. The method of claim 1 wherein the composition includes one or more organic acids.

4. The method of claim 1 wherein the composition includes one or more inorganic bases.

5. The method of claim 1 wherein the composition includes one or more organic bases.

6. A method of treating a semiconductor substrate, comprising:
   providing a semiconductor substrate having an electrically insulative material thereon;
   etching the electrically insulative material; and
   substantially ceasing the etching and removing particles from the substrate by rinsing the substrate with a solution comprising a continuously varying concentration of passivating material; the continuously varying concentration including repetitive iterations of increasing the concentration of the passivating material from a low concentration to a high concentration and of decreasing the concentration of the passivating material from the high concentration to the low concentration; the low and high concentrations differing from one another by at least a factor of ten.

7. The method of claim 6 wherein the passivating material is hydrogen chloride.

8. The method of claim 6 wherein the passivating material comprises a base.

9. The method of claim 6 wherein the passivating material comprises an acid.

10. The method of claim 6 wherein the electrically insulative material is selected from the group consisting of borophosilicate glass, silicon dioxide and silicon nitride.

11. A method of forming openings during semiconductor fabrication, comprising:
   forming a patterned mask over a material, the mask having one or more openings extending therethrough;
   extending the one or more openings into the material by etching the material with an etchant; and
   substantially ceasing the etching by rinsing the substrate with a solution comprising a continuously varying concentration of passivating material and varying the temperature from a low temperature to a higher temperature and back to the low temperature; the continuously varying concentration including repetitive iterations of increasing the concentration of the passivating material from a low concentration to a high concentration and of decreasing the concentration of the passivating material from the high concentration to the low concentration; the low and high concentrations differing from one another by at least a factor of ten.

12. The method of claim 11 wherein the passivating material comprises hydrogen chloride.

13. The method of claim 11 wherein the passivating material comprises an acid or a base.

14. The method of claim 11 wherein the etchant is selected from the group consisting of piranha solution and QE2 solution.

15. The method of claim 11 further comprising ceasing temperature variance and exposing the substrate to static temperature conditions.

16. The method of claim 1 further comprising ceasing variance of concentration of the composition and exposing the substrate to static concentration of the composition.

* * * * *

UNITED STATES PATENT AND TRADEMARK OFFICE
CERTIFICATE OF CORRECTION

PATENT NO. : 8,969,217 B2
APPLICATION NO. : 13/948043
DATED : March 3, 2015
INVENTOR(S) : Janos Fucsko et al.

It is certified that error appears in the above-identified patent and that said Letters Patent is hereby corrected as shown below:

In the Claims

In column 10, lines 66-67, in Claim 10, delete "borophophosilicate" and insert -- borophosphosilicate --, therefor.

Signed and Sealed this
Twenty-first Day of July, 2015

Michelle K. Lee
*Director of the United States Patent and Trademark Office*